United States Patent
Tanaka

(10) Patent No.: US 12,294,350 B2
(45) Date of Patent: May 6, 2025

(54) CAPACITIVE ELEMENT AND ELASTIC WAVE DEVICE

(71) Applicant: KYOCERA Corporation, Kyoto (JP)

(72) Inventor: Hiroyuki Tanaka, Soraku-gun (JP)

(73) Assignee: KYOCERA Corporation, Kyoto (JP)

( * ) Notice: Subject to any disclaimer, the term of this patent is extended or adjusted under 35 U.S.C. 154(b) by 230 days.

(21) Appl. No.: 17/924,882

(22) PCT Filed: May 13, 2021

(86) PCT No.: PCT/JP2021/018189
§ 371 (c)(1),
(2) Date: Nov. 11, 2022

(87) PCT Pub. No.: WO2021/230315
PCT Pub. Date: Nov. 18, 2021

(65) Prior Publication Data
US 2023/0198496 A1    Jun. 22, 2023

(30) Foreign Application Priority Data

May 14, 2020    (JP) ................................ 2020-085336

(51) Int. Cl.
H03H 9/02    (2006.01)
(52) U.S. Cl.
CPC .... H03H 9/02818 (2013.01); H03H 9/02992 (2013.01)

(58) Field of Classification Search
CPC ...................... H03H 9/02992; H03H 9/02818
USPC ........................................ 333/186, 193, 194
See application file for complete search history.

(56) References Cited

U.S. PATENT DOCUMENTS

2017/0222618 A1    8/2017  Inoue et al.
2017/0359051 A1    12/2017  Urata

FOREIGN PATENT DOCUMENTS

| JP | H05-167384 A | 7/1993 |
| JP | 2019-503627 A | 2/2019 |
| WO | 2016/104598 A1 | 6/2016 |

*Primary Examiner* — Rakesh B Patel
(74) *Attorney, Agent, or Firm* — Volpe Koenig

(57) ABSTRACT

A capacitive element includes a piezoelectric substrate, a first electrode finger extending towards a positive side in a first direction, and a second electrode finger disposed facing and spaced apart from the first electrode finger in a second direction intersecting the first direction, extending towards a negative side in the first direction, and connected to a different potential from the first electrode finger. The first electrode finger includes a first portion extending in the first direction and a second portion extending from the first portion, through a first step portion, and at a different position in the second direction from the first portion. The second electrode finger includes a third portion disposed facing the second portion and extending in the first direction, and a fourth portion extending from the third portion through a second step portion, extending from the second portion in the first direction, and facing the first portion.

20 Claims, 11 Drawing Sheets

CAPACITIVE ELEMENT AND ELASTIC WAVE DEVICE

TECHNICAL FIELD

The present disclosure relates to a capacitive element that reduces spurious and an acoustic wave device using the capacitive element.

BACKGROUND OF INVENTION

In recent years, with increasing reduction in the size of electronic components, there has been a growing demand for capacitive elements to be provided on piezoelectric substrates. For example, for an acoustic wave device in which an excitation electrode that excites acoustic waves is formed on a piezoelectric substrate, a configuration has been proposed in which a capacitive element is also provided on the piezoelectric substrate. Patent Literature 1 discloses an example of a capacitive element connected in parallel to a pair of excitation electrodes formed on a piezoelectric substrate in order to improve the resonance characteristics of the excitation electrodes. The capacitive element in Patent Literature 1 consists of a pair of comb electrodes including a plurality of electrode fingers extending parallel to each other.

CITATION LIST

Patent Literature

Patent Literature 1: Japanese Unexamined Patent Application Publication No. 05-167384

SUMMARY

In an aspect of the present disclosure, a capacitive element includes a piezoelectric substrate, a first electrode finger, and a second electrode finger. The first electrode finger is located on the piezoelectric substrate and extends towards a positive side in a first direction. The second electrode finger is located on the piezoelectric substrate, is disposed facing and spaced apart from the first electrode finger in a second direction intersecting the first direction, extends towards a negative side in the first direction, and is connected to a different potential from the first electrode finger. The first electrode finger includes a first portion extending in the first direction and a second portion extending in the first direction from the first portion, through a first step portion, and at a different position in the second direction from the first portion. The second electrode finger includes a third portion disposed facing the second portion and extending in the first direction, and a fourth portion extending from the third portion, through a second step portion, disposed on a virtual line extending from the second portion in the first direction, and facing the first portion.

In an aspect of the present disclosure, an acoustic wave device includes an interdigital transducer (IDT) electrode formed on the piezoelectric substrate and the above-described capacitive element electrically connected to the IDT electrode.

DESCRIPTION OF EMBODIMENTS

Figure 1:
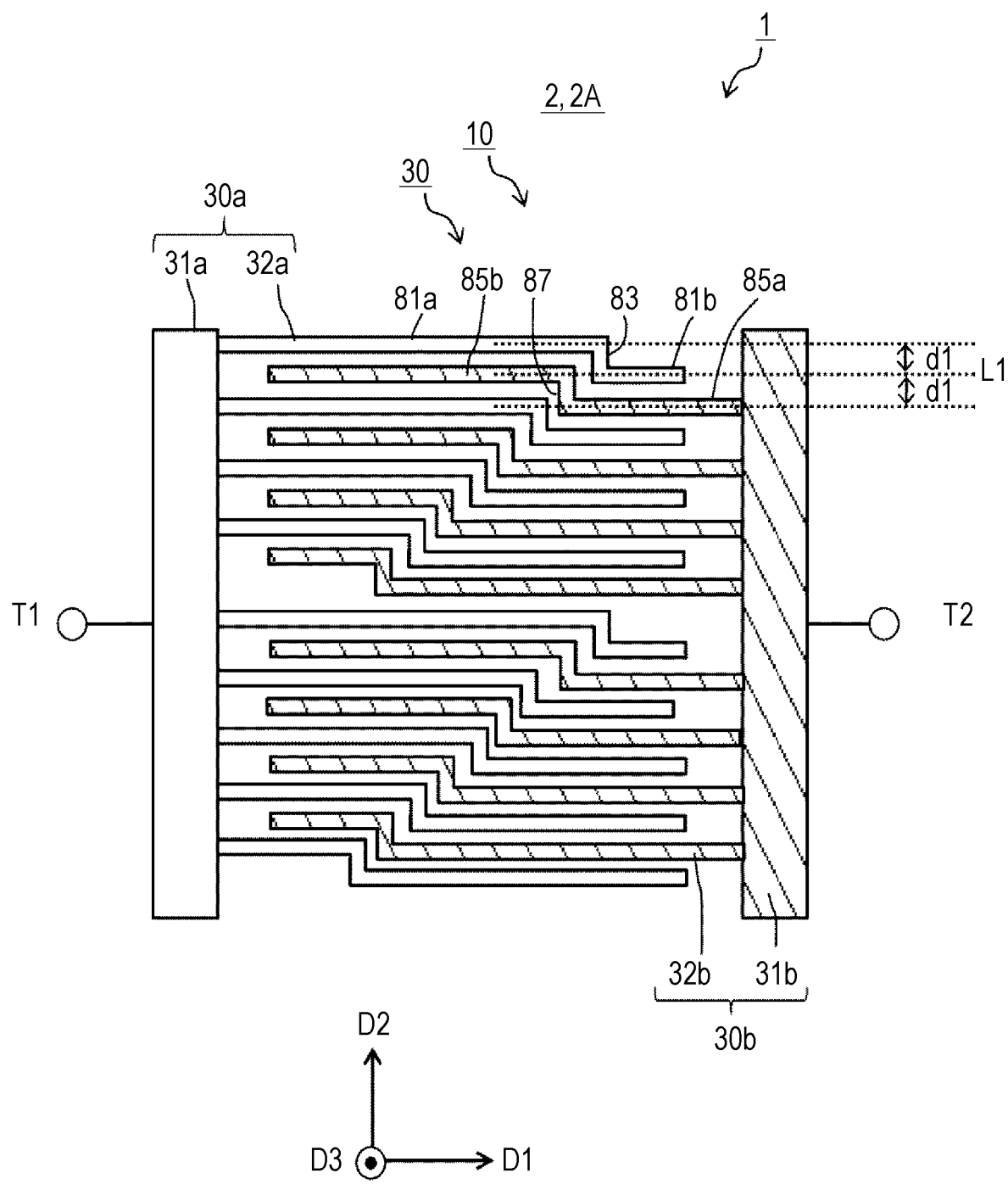
FIG. 1 is a plan view illustrating a capacitive element according to an embodiment of the present disclosure.

Hereafter, capacitive elements and acoustic wave devices according to embodiments of the present disclosure are described in detail using the drawings. Note that the drawings used in the following description are schematic drawings, and the proportions of the dimensions and so forth in the drawings do not necessarily match the actual proportions of the dimensions and so forth.

In the description of variations and so on, configurations identical or similar to those in previously described embodiments may be indicated using the same reference symbol used in the previously described embodiments and description thereof may be omitted.

Although any direction may be regarded as being up or down in relation to a capacitive element or an acoustic wave device, for convenience, mutually orthogonal directions D1, D2, and D3 are defined, a positive side in the direction D3 is regarded as "up", and terms such as "upper surface" and "lower surface" are used hereinafter. The Cartesian coordinate system defined by the directions D1, D2, and D3 is defined on the basis of the shape of the capacitive element and the acoustic wave device, and does not refer to the crystal axes (X, Y, and Z axes) of the piezoelectric crystal constituting the piezoelectric substrate. Components having similar basic configurations may be described without being distinguishing between by omitting "first", "second", and so on.

<Capacitive Element>

FIG. 1 is a plan view of a capacitive element 1 according to an embodiment of the present disclosure.

The capacitive element 1 includes a piezoelectric substrate 2 composed of piezoelectric crystal and a capacitive part 10 provided on an upper surface 2A of the piezoelectric substrate 2.

The piezoelectric substrate 2 is composed of a single crystal (piezoelectric crystal) having piezoelectric properties composed of, for example, lithium niobate (LN) ($LiNbO_3$) crystal or lithium tantalate (LT) ($LiTaO_3$) crystal. Specifically, for example, the piezoelectric substrate 2 is composed of an LT substrate having a 32° to 52° Y-X cut. The planar shape and dimensions of the piezoelectric substrate 2 may be set as appropriate.

The piezoelectric crystal of piezoelectric substrate 2 has XYZ axes as crystal axes, and when an X propagation substrate is used, the X axis and the direction D2 coincide with each other. In other words, the X-axis and the direction D2 correspond to the propagation direction of the acoustic waves.

The capacitive part 10 is disposed on the upper surface 2A of the piezoelectric substrate 2. The capacitive part 10 forms a capacitor with an interdigital electrode in which a pair of comb electrodes 30 (30a and 30b) mesh with each other.

The comb electrodes 30 consist of, for example, metal conductive layers. So long as the metal a conductive material, the metal is not particularly limited, and may be, for example, Al or an Al-based alloy (Al alloy). The Al alloy is, for example, an Al—Cu alloy. The comb electrodes 30 may be composed of a plurality of metal layers. The thickness (in the direction D3) of the comb electrodes 30 may be, for example, from 50 nm to 600 nm.

The comb electrodes 30 may be disposed directly on the upper surface 2A of the substrate 2 or may be disposed on the upper surface 2A of the piezoelectric substrate 2 with a base layer composed of another member interposed therebetween. The other member may be composed of, for example, Ti, Cr, or an alloy of any of these materials. When the comb electrodes 30 are disposed on the upper surface 2A of the substrate 2 with a base layer interposed therebetween, the thickness of the other member is set to a thickness that will negligibly affect the electrical characteristics of the comb electrodes 30 (for example, 5% of the thickness of the comb electrodes 30 when Ti is used).

A dielectric for protecting the comb electrodes 30 may be disposed on the comb electrodes 30. For example, a resin material such as epoxy resin, SiOx, SiNx, and so on may be used as the dielectric.

Next, the shape of the comb electrodes 30 will be described. A first comb electrode 30a includes a first bus bar 31a and a plurality of first electrode fingers 32a connected to the first bus bar 31a. A second comb electrode 30b includes a second bus bar 31b and second electrode fingers 32b connected to the second bus bar 31b. The first bus bar 31a and the second bus bar 31b are disposed so as to be spaced apart from each other in the direction D1 in the figure.

Here, the first bus bar 31a and the second bus bar 31b are connected to different potentials from each other. Consequently, the first electrode fingers 32a and the second electrode fingers 32b are connected to different potentials from each other. The first comb electrode 30a and the second comb electrode 30b are disposed so that their respective electrode fingers 32 mesh with each other in an alternating manner, and the first electrode fingers 32a and the second electrode fingers 32b are arranged so as to be spaced apart from each other. Here, the electrode finger widths of the first comb electrode 30a and the second comb electrode 30b may be constant. In FIG. 1, for ease of understanding, portions having the same potential as the second electrode fingers 32b are shaded with hatching.

Figure 2:
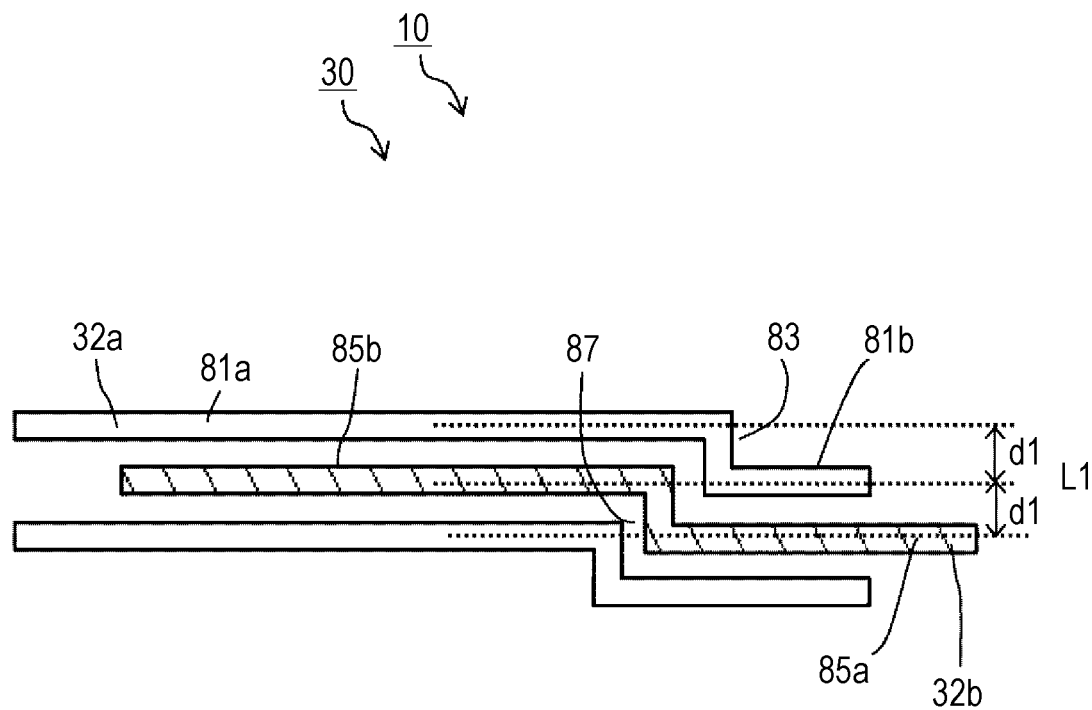
FIG. 2 is an enlarged view of a main part of FIG. 1.
Figure 2:
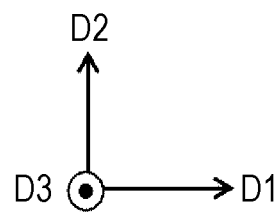

The first electrode fingers 32a and the second electrode fingers 32b are described in detail using FIG. 2. FIG. 2 is an enlarged view of the main parts of the first electrode fingers 32a and the second electrode fingers 32b. The first electrode fingers 32a extend from the first bus bar 31a towards the positive side in the direction D1 (first direction). The second electrode fingers 32b extend from the second bus bar 31b towards the negative side in the direction D1. In addition, since the first electrode fingers 32a and the second electrode fingers 32b are disposed so as to face each other, capacitances are formed in accordance with the gaps therebetween in a second direction intersecting the direction D1 (in this example, a direction D2 that is perpendicular to the direction D1 is the second direction).

Each first electrode finger 32a is bent partway therealong while extending in the direction D1. Specifically, each first electrode finger 32a includes a first portion 81a and a second portion 81b extending in the direction D1, and a first step portion 83 is located therebetween. This first step portion 83 enables the two portions to have different positions from each other in the direction D2. Specifically, the first portion 81a and the second portion 81b are disposed so as to be spaced apart from each other so that the distance from the center of the first portion 81a to the center of the second portion 81b in the direction D2 (center spacing) is a first spacing d1.

The second electrode finger 32b facing this first electrode finger 32a is similarly bent partway therealong while extending in the direction D1. Specifically, each second electrode finger 32b includes a third portion 85a and a fourth portion 85b extending in the direction D1, and a second step portion 87 is located therebetween. This enables the two portions to have different positions from each other in the direction D2. Specifically, the third portion 85a and the fourth portion 85b are disposed so as to be spaced apart from each other so that the distance from the center of the third portion 85a to the center of the fourth portion 85b in the direction D2 (center spacing) is the first spacing d1. The fourth portion 85b is located on a virtual line L1 extending from the second portion 81b in the direction D1 and faces the first portion 81a in the direction D2. Similarly, the third portion 85a faces the second portion 81b in the direction D2.

By arranging the electrode fingers 32, which have different potentials from each other, on the piezoelectric substrate 2, acoustic waves are generated, which are standing waves having a half wavelength equal to the center spacing between the electrode fingers 32. As a result of providing the step portions partway along the electrode fingers 32 in this way, acoustic waves having different phases from each other are generated in one electrode finger 32 and acoustic wave resonance generated by the capacitive part 10 can be suppressed. In particular, since the first spacing d1 is half the repetition interval of the first electrode fingers 32a, the phase of the acoustic waves is shifted by exactly half the wavelength between the first portion 81a and the second portion 81b, and the effect of suppressing resonance characteristics can be enhanced.

Since each second electrode finger 32b is also provided with the second step portion 87 extending along the first step portion 83 of the corresponding first electrode finger 32a, the area across which the electrode fingers 32 face each other can be better secured in the capacitive part 10, and the desired capacitance value can be obtained. Furthermore, since both types of electrode fingers 32 are shaped so that one extends along the other, the desired capacitance value can be achieved without increasing the size of the planar shape of the capacitive part 10. The center spacing between the first step portion 83 and the second step portion 87 may be the first spacing d1 (example illustrated in the figure) but does not have to be the first spacing d1.

Furthermore, in the example illustrated in FIG. 1, in the plurality of electrode fingers 32, the plurality of step portions 83 and 87 are disposed so as to be slightly shifted from each other and arrayed in the direction D1. In other words, the plurality of first electrode fingers 32a includes a region where the proportion of one electrode finger 32 occupied by the first portion 81a gradually increases and conversely the proportion of one electrode finger 32 occupied by the second portion 81b gradually decreases as one moves towards the positive side in the direction D2.

Figure 3A:
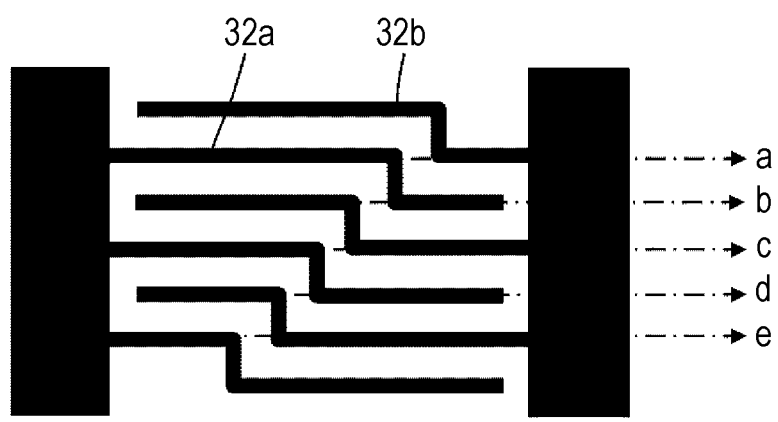
FIG. 3A is a schematic diagram illustrating an outline of the capacitive element illustrated in FIG. 1.
Figure 3B:
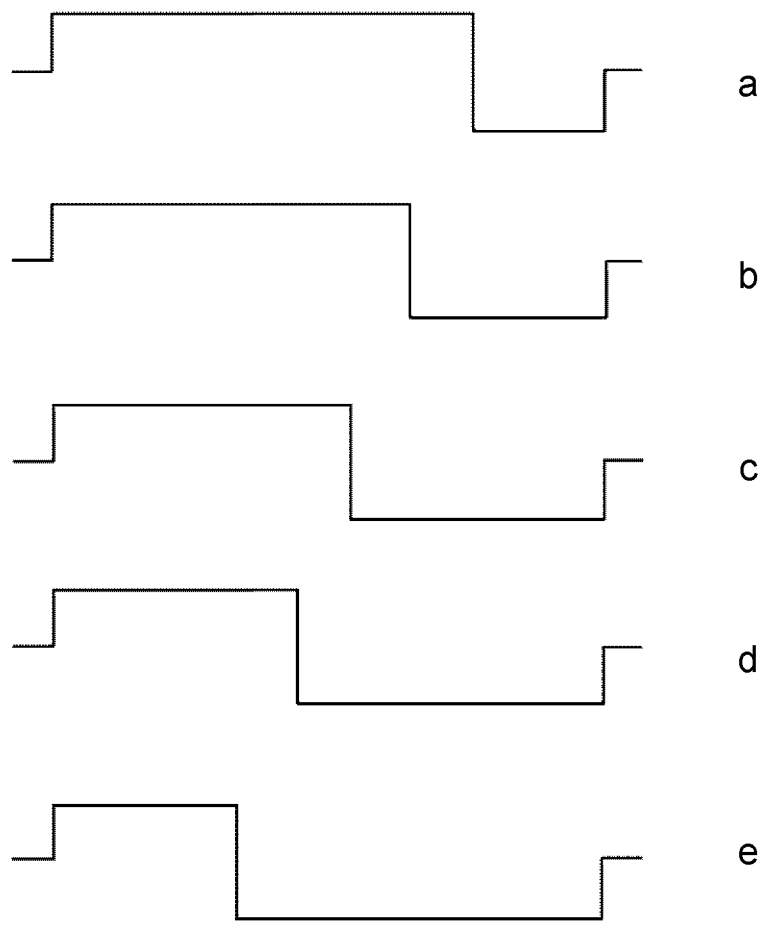
FIG. 3B is a schematic diagram illustrating the waveforms of acoustic waves in the capacitive element illustrated in FIG. 1.

This configuration enables the resonance characteristics of the capacitive part 10 to be further reduced. The mechanism responsible for this will be explained using the schematic diagrams illustrated in FIGS. 3A and 3B. As illustrated in FIG. 3A, positions a to e of the electrode fingers 32 in the direction D2 are defined for one period. The excitation waveforms of the acoustic waves at each of these positions are illustrated in FIG. 3B. Adding the excitation waveforms illustrated in FIG. 3B together, it can be seen that the individual excitation characteristics cancel each other out. Thus, because the positions of the step portions are shifted with respect to each other, the excitation waveforms at the respective positions are different from each other, and by adding the waveforms together, the excitations of the waveforms cancel each other out, resulting in a reduction in spurious caused by the resonance characteristics across the entire capacitive part 10.

In order to effectively cancel out the excitation characteristics across the entire capacitive part 10, the difference between the sum of the lengths of the first portions 81a ("first sum") and the sum of the lengths of the second portions 81b ("second sum") in the plurality of first electrode fingers 32a may be less than or equal to the length of one of the first electrode fingers 32a. In other words, the first sum and the second sum may be made substantially identical. The length of one first electrode finger 32a here is the length in the first direction (direction D1) (the length seen when the first electrode finger 32a is projected in a direction perpendicular to the first direction). In other words, the length of the first step portion 83 in the direction D2 may be ignored. Although the description has been given for the first electrode finger 32a (first portion 81a and second portion 81b), the same may be true for (but does not have to be) the second electrode finger 32b (third portion 85a and fourth portion 85b).

In the example illustrated in FIG. 1, in the plurality of electrode fingers 32, the plurality of step portions 83 and 87 are positioned so as be slightly shifted from each other and arrayed in the direction D1, and therefore the step portions 83 and 87 are also located near the center, in the electrode finger extension direction, of the region where the electrode fingers 32a and 32b cross each other. With this configuration, acoustic waves in the parts where the vibration of the acoustic waves is the largest can be suppressed, and therefore spurious intensity can be further suppressed.

In order to confirm the frequency characteristics realized by the capacitive part 10 described above, models were created and simulations were performed. Specifically, as Example 1, a model of the capacitive element 1 was created with the following conditions.
Piezoelectric substrate 2: 42° Y-cut X-propagation LT substrate
Thickness of piezoelectric substrate 2: Half wavelength of acoustic waves generated by IDT electrode described below
A support substrate composed of Si is disposed on the lower surface of the piezoelectric substrate 2.

As Comparative Example 1, a model was created with the same conditions as in Example 1, except that the first and second electrode fingers 32a and 32b were not provided with the step portions 83 and 87, respectively.

Figure 4A:
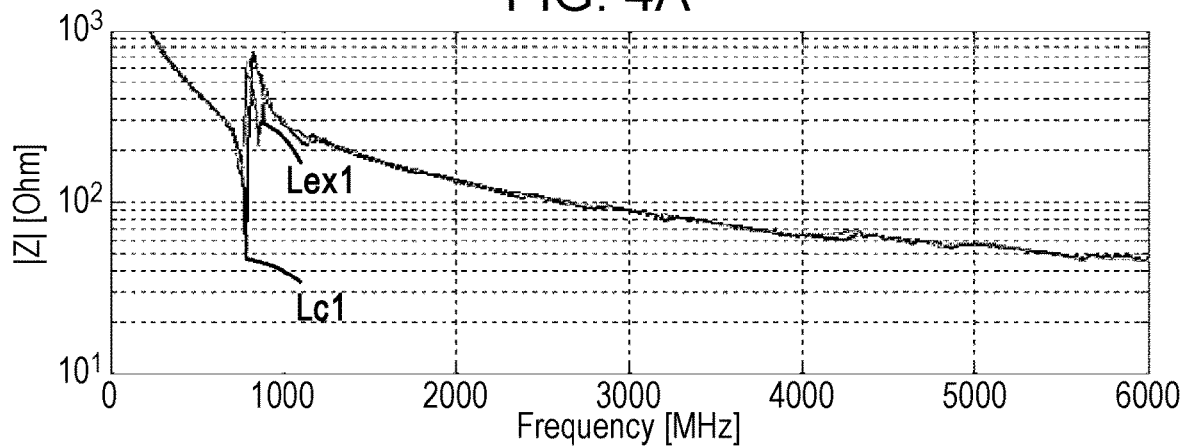
FIG. 4A is a chart illustrating frequency characteristics of the capacitive element illustrated in FIG. 1.
Figure 4B:
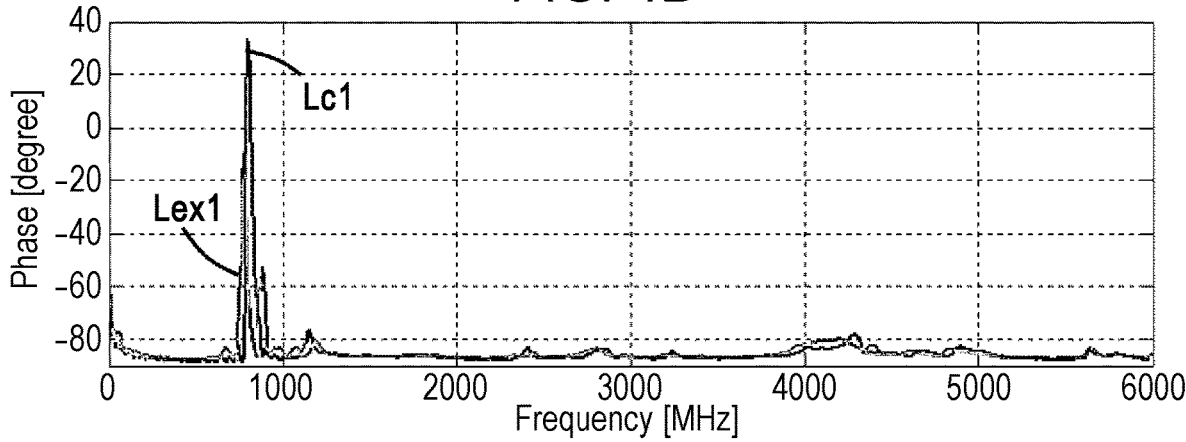
FIG. 4B is another chart illustrating the frequency characteristics of the capacitive element illustrated in FIG. 1.
Figure 4C:
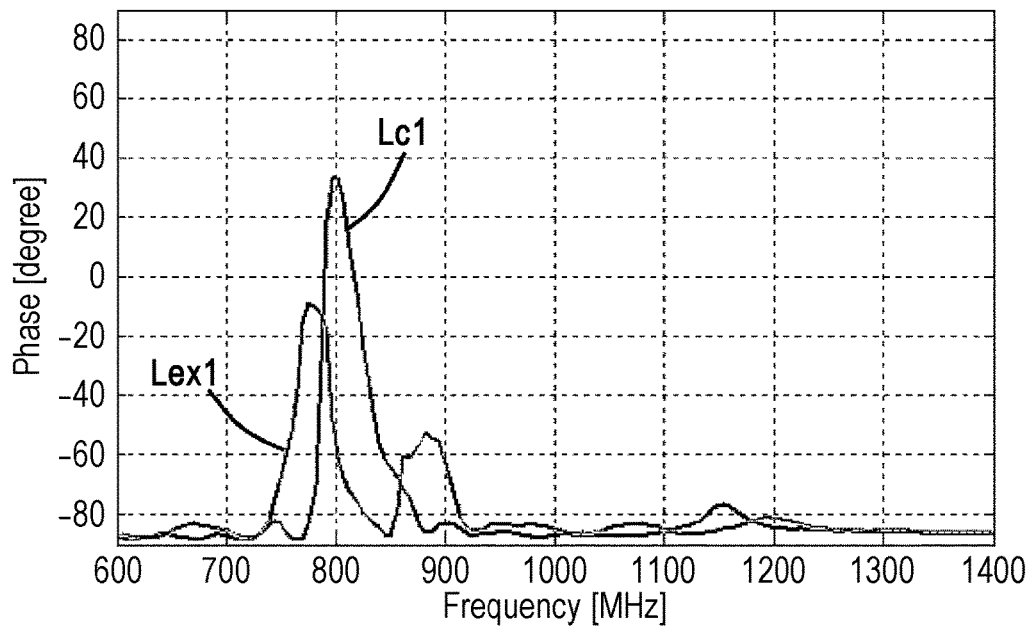
FIG. 4C is an enlarged view of a portion of FIG. 4B.

Simulation results of the frequency characteristics of the capacitive elements of Example 1 and Comparative Example 1 are illustrated in FIGS. 4A to 4C. In FIG. 4A, the horizontal axis represents frequency and the vertical axis represents impedance. In FIGS. 4B and 4C, the horizontal axis represents frequency and the vertical axis represents phase. FIG. 4C is an enlarged view of a main part of FIG. 4B. In FIGS. 4A to 4C, the characteristics of Example 1 are illustrated by a line Lex1, and the characteristics of Comparative Example 1 are illustrated by a line Lc1.

As is clear from FIGS. 4A to 4C, it was confirmed that the phase in the vicinity of 750 MHz to 850 MHz in Example 1 was closer to −90° than in Comparative Example 1, and that spurious was reduced. In addition, no new spurious or the like due to bending was observed.

Figure 5:
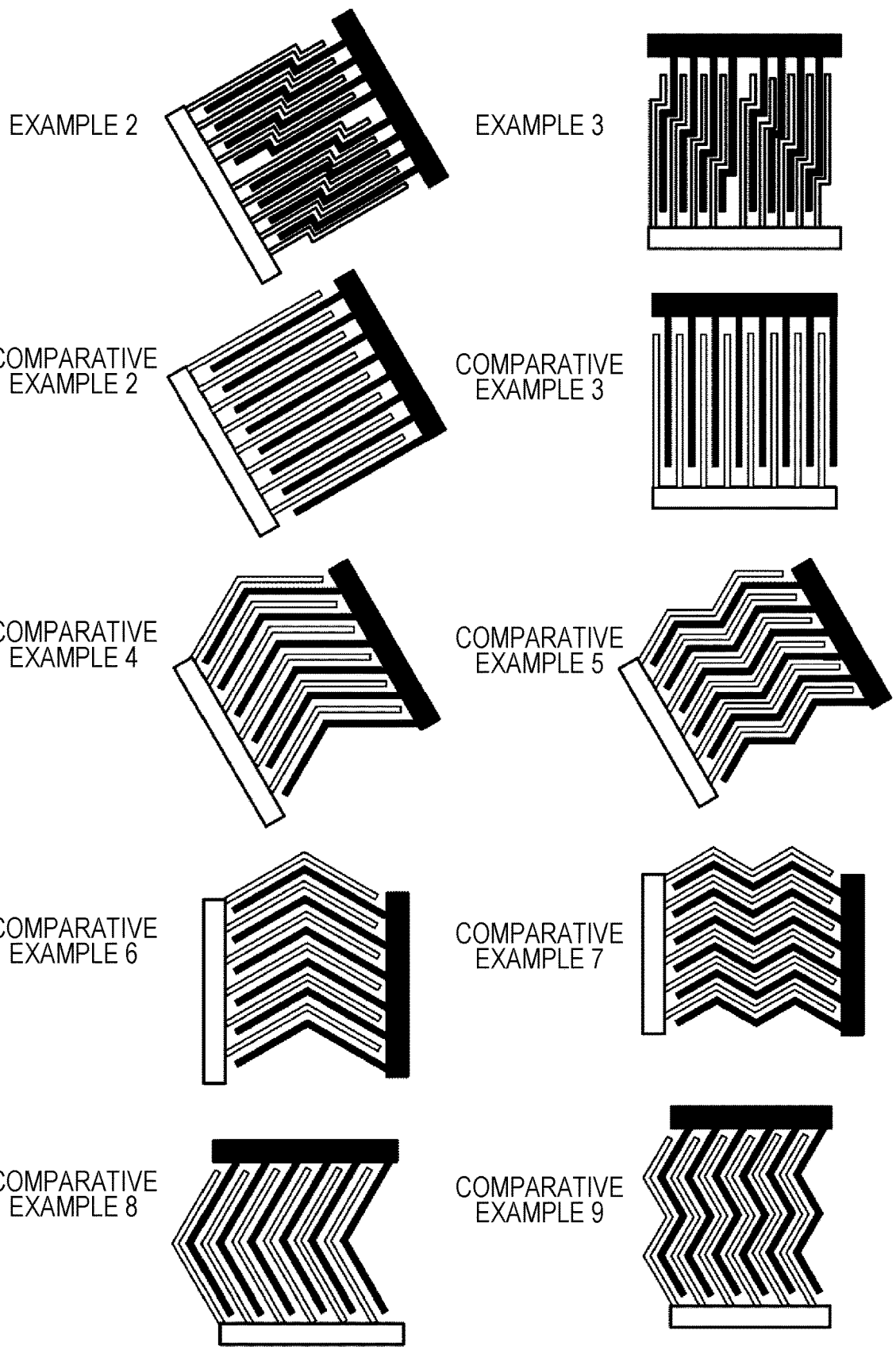
FIG. 5 is a diagram for explaining simulation models.

Next, in order to confirm the effect of the direction in which the electrode fingers 32 are repeatedly arranged on the frequency characteristics and the effect of the direction in which the first to fourth portions 81a to 85b extend on the frequency characteristics, models were created and simulations were performed for Examples 2 and 3 and Comparative Examples 2 to 9. The schematic configuration of each model is illustrated in FIG. 5. In FIG. 5, the direction of propagation of the acoustic waves is the vertical direction of the sheet, like in FIGS. 1 and 2.

As illustrated in FIG. 5, Examples 2 and 3 differ from Example 1 in that the direction in which the electrode fingers are repeatedly arranged is respectively inclined at 30° and 90° with respect to the direction of propagation of the acoustic waves (in this example, the X axis direction of the piezoelectric crystal). The rest of the configuration is the same as in Example 1.

Similarly, Comparative Examples 2 and 3 differ from Comparative Example 1 in that the direction in which the electrode fingers are repeatedly arranged is respectively inclined at 30° and 90° with respect to the direction of propagation of the acoustic waves.

In Comparative Examples 4 and 5, the electrode fingers are each provided with one or three bends partway therealong where the electrode fingers bend at an angle of 60°. In each electrode finger, one part on one side of a bend has a direction of repeated arrangement the same as (0°) the direction of propagation of the acoustic waves, whereas the other part has an angle of 60° with respect to the direction of propagation of the acoustic waves. Comparative Examples 6 to 9 are obtained by rotating Comparative Examples 4 and 5. Specifically, in Comparative Examples 6 and 7, the direction in which the electrode fingers are repeatedly arranged is inclined at an angle of +30° in one part of each electrode finger on one side of the bend and at an angle of −30° for the other part with respect to the direction of propagation of the acoustic waves. In Comparative Examples 8 and 9, the direction in which the electrode fingers are repeatedly arranged is inclined at an angle of +60° in one part of each electrode finger on one side of the bend and at an angle of −60° in the other part with respect to the direction of propagation of the acoustic waves.

Figure 6A:
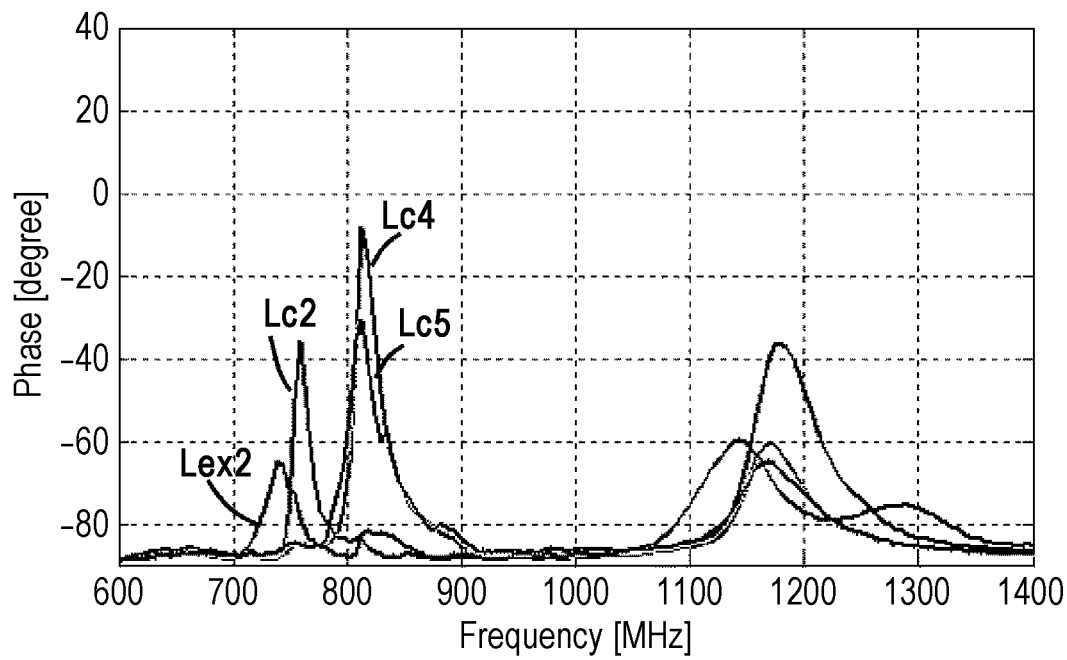
FIG. 6A is a chart illustrating the frequency characteristics of capacitive elements of examples and comparative examples.
Figure 6B:
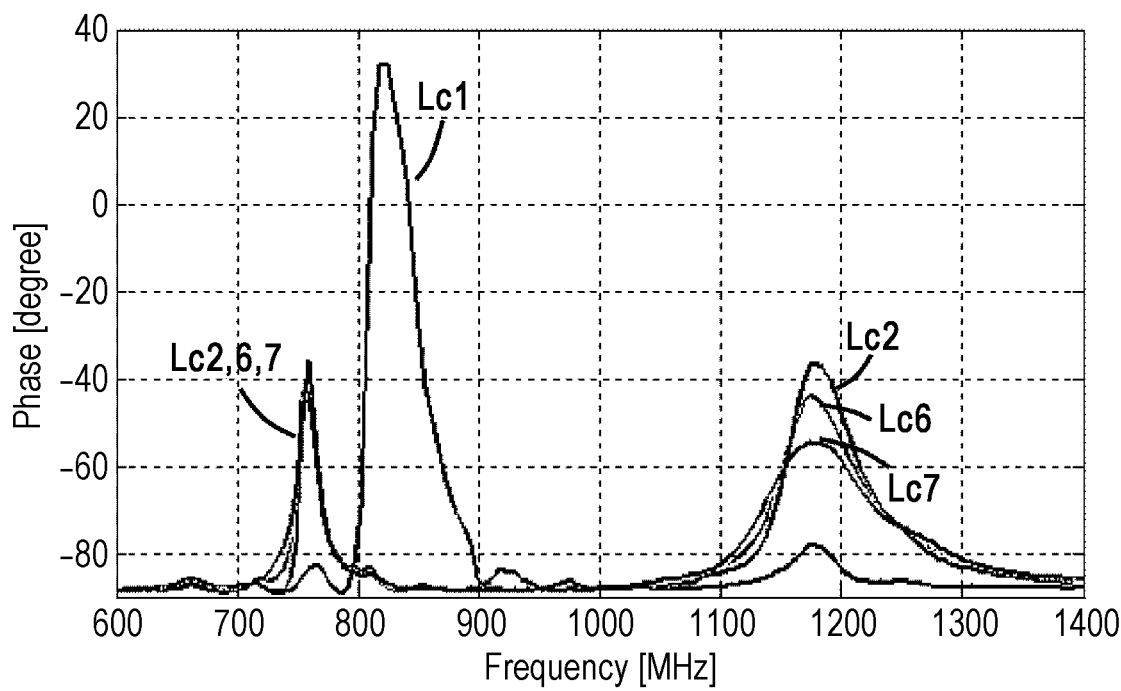
FIG. 6B is another chart illustrating the frequency characteristics of capacitive elements of examples and comparative examples.
Figure 6C:
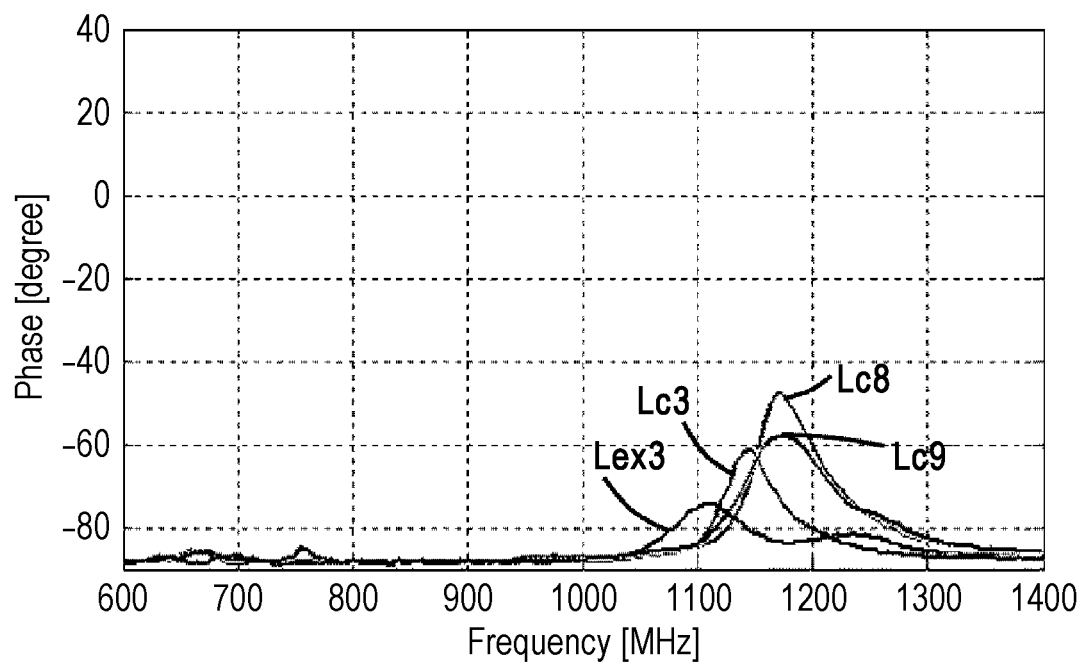
FIG. 6C is yet another chart illustrating the frequency characteristics of capacitive elements of examples and comparative examples.

Simulation results for each of the above models are illustrated in FIGS. 6A to 6C. FIGS. 6A to 6C correspond to FIG. 4C. In FIG. 6A, the frequency characteristics of Example 2 are compared with those of Comparative Examples 2, 4, and 5. In FIG. 6B, the frequency characteristics of Comparative Examples 1, 2, 6, and 7 are compared with each other. In FIG. 6C, the frequency characteristics of Example 3 are compared with those of Comparative Examples 3, 8, and 9. In FIGS. 6A to 6C, the characteristics of Examples 2 and 3 are denoted as Lex2 and Lex3, and those of Comparative Examples 1 to 9 are denoted as Lc1 to Lc9.

It is clear from FIGS. 6A to 6C that the models of Examples 2 and 3 have smaller spurious than those of Comparative Examples 2 and 3. This confirms that the frequency characteristics of the capacitive part 10 can be improved regardless of the arrangement direction of the electrode fingers 32 with respect to the propagation angle of the acoustic waves.

Furthermore, as is clear from the simulation results of the models of Comparative Examples 4 to 9, simply providing bends and different angles of electrode fingers only results in there being a plurality of arrangement directions of electrode fingers. Therefore, although it is possible to shift the direction in which the electrode fingers are arranged from the arrangement direction where spurious is largest, it is not possible to reduce the spurious intensity in the shifted arrangement direction.

In contrast, in the models of Example 1-3, the spurious intensity in the arrangement direction of certain electrode fingers is reduced by aligning the directions of extension of the first to fourth portions 81a to 85b and by positioning them in a periodic manner.

From the above, it was confirmed that the capacitive element of the present disclosure can reduce spurious regardless of the arrangement direction of the electrode fingers.

In addition, it was confirmed that spurious can be reduced without increasing the outer size even compared to configurations such as those in which bends are provided in the electrode fingers.

<Variation>

Figure 7:
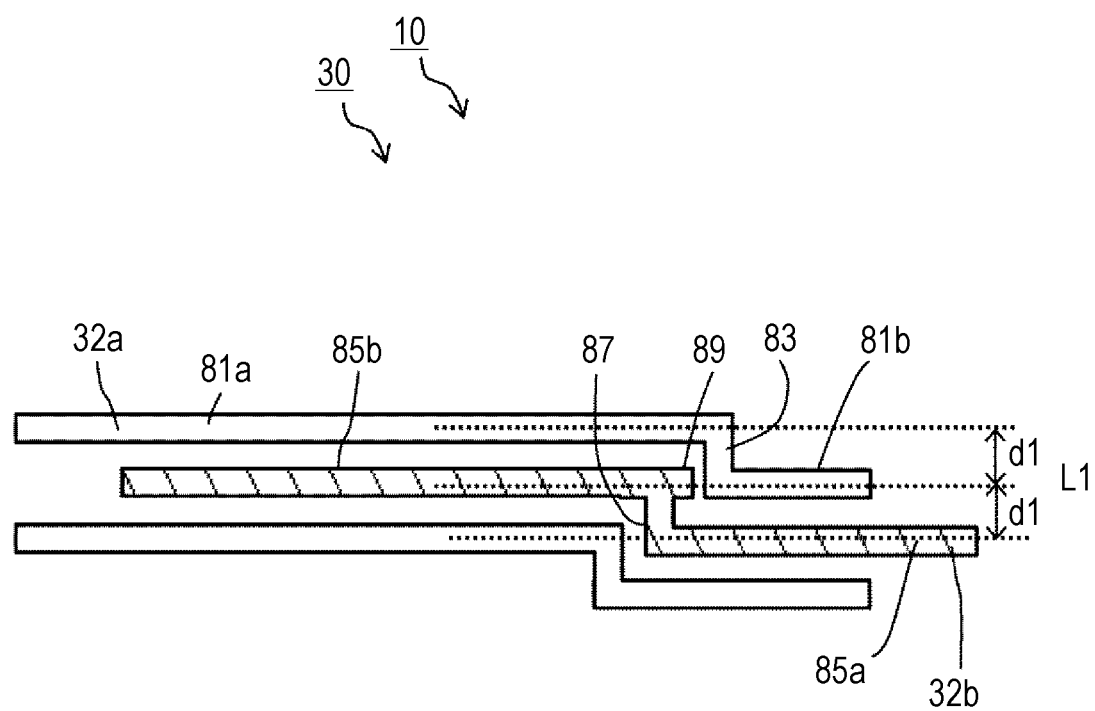
FIG. 7 is an enlarged view of a main part of a capacitive element according to a variation.

FIG. 7 illustrates a variation of the electrode fingers 32. FIG. 7 is an enlarged view of a main part in the vicinity of the step portions 83 and 87. The electrode finger 32 is provided with a protrusion 89 extending in the first direction beyond the step portion 83 or 87. By providing the protrusion 89, for example, the area facing the other electrode finger 32 can be increased. This enables the size of the capacitive element to be further reduced.

More precisely, in FIG. 7, the protrusion 89 extends from the connection between the fourth portion 85b and the second step portion 87 towards the second portion 81b on the virtual line L1 relating to the fourth portion 85b. Unlike in the illustrated example, the protrusion 89 may extend from the connection between the third portion 85a and the second step portion 87 towards the first portion 81a on the virtual line L1 relating to the third portion 85a. The protrusion 89 may extend from the connection between the first portion 81a and the first step portion 83 towards the third portion 85a on the virtual line L1 relating to the first portion 81a. The protrusion 89 may extend from the connection portion between the second portion 81b and the first step portion 83 towards the fourth portion 85b on the virtual line L1 relating to the second portion 81b. A combination of two or more of the above four types of protrusions 89 may be provided.

The shape and dimensions of the protrusion 89 are chosen as appropriate. For example, the protrusion 89 may have a rectangular shape (example illustrated in the figure) or have a shape in which the edge of the tip thereof bulges outwards (for example, a semicircle shape). The width of the protrusion 89 may be the same as or different from the width of the rest of the electrode finger 32. The amount of protrusion of the protrusion 89 may be larger than, equal to, or smaller than the width of the protrusion 89 or the rest of the electrode finger 32. Although not specifically illustrated, a protrusion may be provided that protrudes from the step portion 83 or 87 in a direction that intersects the first direction.

<Variation>

Figure 8:
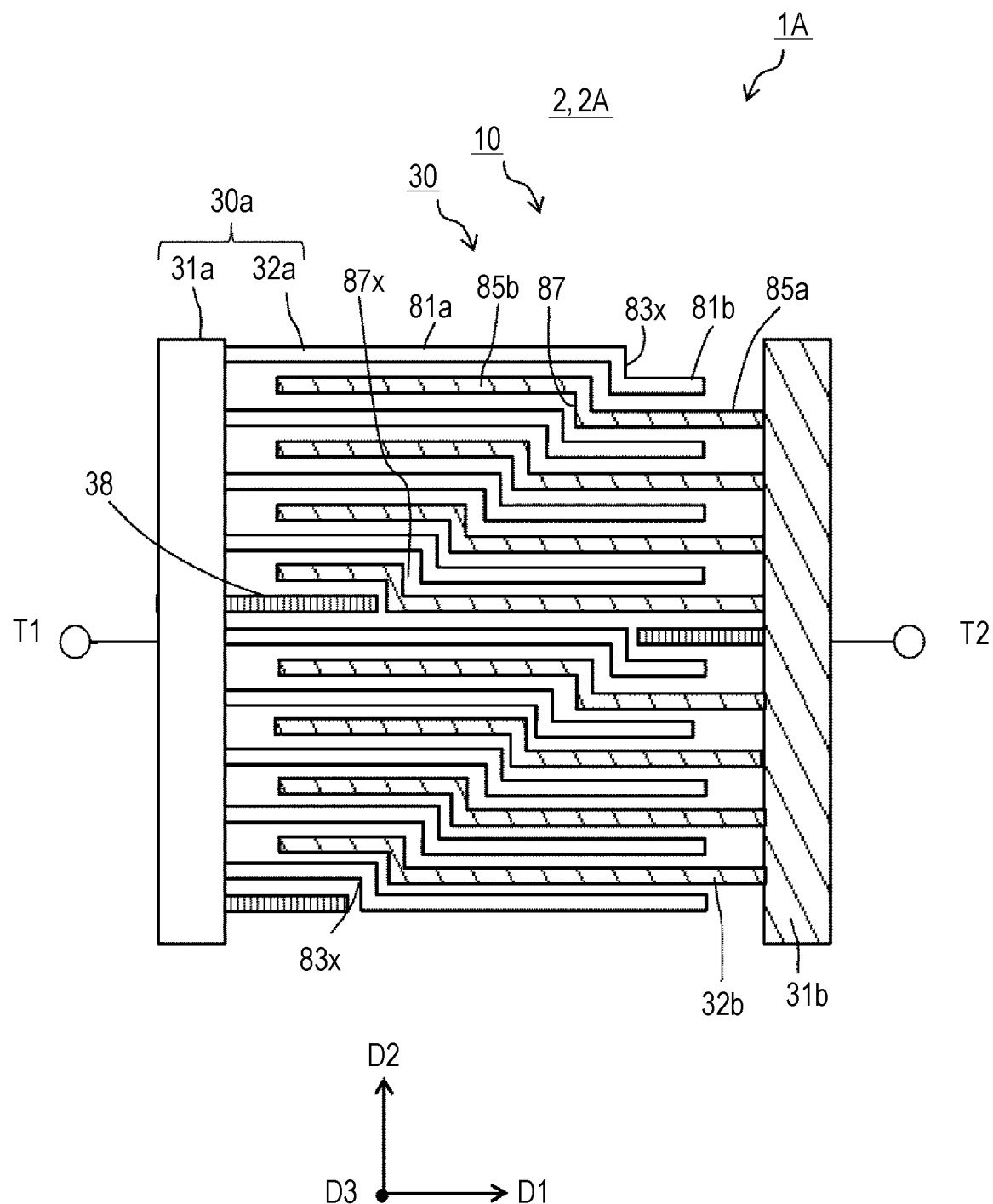
FIG. 8 is a plan view illustrating a capacitive element according to a variation.

FIG. 8 illustrates a capacitive element 1A, which is a variation of the capacitive element 1. The capacitive element 1A is provided with insertion electrode fingers 38 that are adjacent to the electrode fingers 32 equipped with the step portions 83x and 87x located outermost in the direction of extension of the electrode fingers 32 (in this example, the direction D1) among the plurality of step portions 83 and 87, so as to fill the step portions. The step portions located outermost are, in other words, the step portions located furthermost towards the positive side or the negative side in the first direction (direction D1).

Specifically, as illustrated in FIG. 8, when the step portion 83x is close to the first bus bar 31a, an insertion electrode finger 38, which is electrically connected to the first bus bar 31a on a line extending from the second portion 81b, is provided for the first electrode finger 32a including the first step portion 83x. In this case, the insertion electrode finger 38 may be electrically connected to the first electrode finger 32a including the step portion 83x. The tip of the insertion electrode finger 38 may face the step portion 83x across a gap (example illustrated in the figure) or may be connected to the step portion 83x. The insertion electrode finger 38 is located on a line extending from the second portion 81b along the entire length thereof.

When the step portion 83x is close to the second bus bar 31b, the insertion electrode finger 38, which is electrically connected to the second bus bar 31b, is provided on a line extending from the first portion 81a of the first electrode finger 32a including the first step portion 83x. In this case, the potential of the insertion electrode finger 38 is different from the potential of the first electrode 32a including the step portion 83x described above. Consequently, the capacitance of the capacitive element 1A is increased by the insertion electrode finger 38 and the second portion 81b facing each other in the direction D2. The tip of the insertion electrode finger 38 faces the step portion 83x across a gap. The insertion electrode finger 38 is located on a line extending from the first portion 81a along the entire length thereof.

Similarly, when the step portion 87x is close to the first bus bar 31a, an insertion electrode finger 38, which is electrically connected to the first bus bar 31a on a line extending from the third portion 85a, may be provided for the second electrode finger 32b including the step portion 87x. When the step portion 87x is close to the second bus bar 31b, an insertion electrode finger 38 may be provided that is located on a line extending from the fourth portion 85b and is electrically connected to the second bus bar 31b.

Thus, by providing the insertion electrode fingers 38, the spacing to the electrode fingers 32 connected to the other potential can be kept constant. In addition, since the insertion electrode fingers 38 act as thinning electrodes, spurious can be reduced.

<Variation>

In the above-described examples, a support substrate is provided on the lower surface of the piezoelectric substrate 2 in the direction D1. However, an intermediate layer such as one composed of silicon oxide may be provided between the piezoelectric substrate 2 and the support substrate, an acoustic reflection film may be provided, the thickness of the piezoelectric substrate 2 may be increased and additional structures do not have to be provided on the lower surface of the piezoelectric substrate 2.

In the above examples, the case where only one step portion 83 or 87 is provided in each electrode finger 32 is described as an example, but a plurality of such step portions may instead be provided. In this case, the two or more step portions in one electrode finger 32 may shift three or more portions within one electrode finger 32 towards the same side in the direction D2 or towards different sides in the direction D2. In other words, one electrode finger 32 including two or more step portions may extend in a staircase-like manner or may extend in zigzag manner in at least part thereof. It is easier to predict the effect of acoustic waves on spurious, for example, if there is only one step portion.

The step portions 83 and 87 do not have to formed as right angles, and may instead be formed so as to be inclined at an angle. In other words, the step portions do not have to extend in a direction perpendicular to the direction of extension (direction D1) of the electrode fingers (first to fourth portions, and so on), and may instead extend in a direction inclined relative to the direction of extension. In this case, the step portions may be inclined towards either the positive or negative side in the direction D1. The step portions do not have to extend in a straight line, and may instead be curved. However, if a step portion is formed as a right angle, for example, the length of the first step portion 83 is minimized when the first portion 81a and the second portion 81b are shifted relative to each other by the prescribed first spacing d1. As a result, it is expected that the effect described while referring to FIG. 3B will be improved.

In the examples described above, the width of electrode fingers 32 was constant from the busbar to the tips. However, the width of the electrode fingers 32 may vary with respect to the position in the length direction. For example, in the first electrode fingers 32a, any out of the first portion 81a, the first step portion 83, and the second portion 81b may be wider than the other portions. The width may also vary in each of the above portions. The same applies the second electrode fingers 32b.

In the above examples, a case in which a plurality of first electrode fingers 32a and a plurality of second electrode fingers 32b are provided is described, but just a pair of first and second electrode fingers 32a and 32b may instead be used. In other words, the capacitive element may include only one first electrode finger 32a and one second electrode finger 32b. In this case, the busbars are not needed.

In the examples described above, the electrode fingers 32 have the same width and length as each other and are also disposed at a constant pitch (For example, center spacing. Refer to first spacing d1). However, the electrode fingers 32 may have different widths and/or lengths from each other and the pitch does not have to be constant. For example, the width, length and/or pitch of a small number of electrode fingers 32 may differ from the width, length and/or pitch of the majority of the electrode fingers 32 in order to fine tune the capacitance of the capacitive element.

<Acoustic Wave Device>

Figure 9:
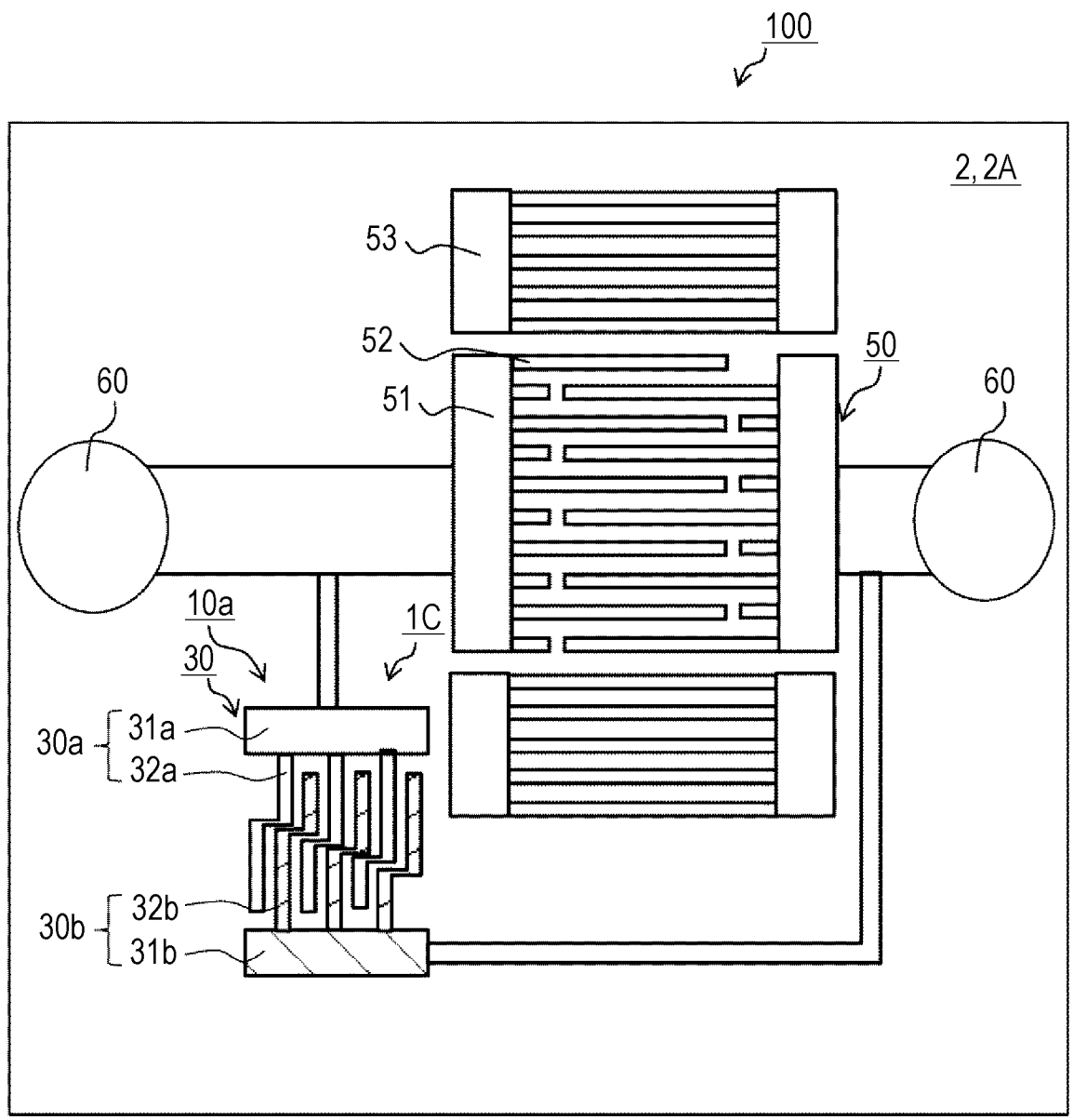
FIG. 9 is a plan view illustrating an acoustic wave device according to an embodiment of the present disclosure.

Next, an acoustic wave device of an embodiment of the present disclosure will be described using FIG. 9. As illustrated in FIG. 9, an acoustic wave device 100 includes an IDT electrode 50 on the upper surface 2A of the piezoelectric substrate 2. The IDT electrode 50 and a capacitive element 1C (from another perspective, a capacitive part 10a) are electrically connected to each other. Furthermore, in this example, external terminals 60 (example of terminals T1 and T2 in FIG. 1) electrically connected to the IDT electrode 50 are provided. A cover, which is not illustrated, may be provided in order to house the IDT electrode 50.

The IDT electrode 50 is basically structured the same as or similar to the pair of comb electrodes 30 of the capacitive part 10, except that the step portions are not provided, and includes a pair of bus bars 51 and electrode fingers 52. In the IDT electrode 50, the electrode fingers 52 connected to different potentials are arranged so as to cross each other in an alternating manner. The arrangement direction is along the X-axis of the piezoelectric crystal. A pair of reflectors 53 may be provided on both sides of the IDT electrode 50. With this configuration, a one-port resonator in which acoustic waves are excited along the X-axis is realized. Normally, the above configuration (materials, thicknesses, and so on) would usually be the same as that of the capacitive part 10, since the capacitive part 10 is formed at the same time as the IDT electrode 50 to be connected thereto.

By connecting the capacitive element 1 in parallel with the IDT electrode 50, the difference between the anti-resonant frequency and the resonant frequency of the resonator can be reduced.

The pitch of the electrode fingers 32 of each capacitive part 10 of the capacitive element 1 (Refer to the first spacing d1. Similarly applies to the electrode fingers 52) and the pitch of the electrode fingers 52 of the IDT electrode 50 may be made different from each other. This is in order to suppress the effect that occurs in the capacitive part 10 when a high-frequency signal is input in order to excite acoustic waves in the IDT electrode 50. In this example, the arrangement direction of the electrode fingers 32 of the capacitive element 1C is made perpendicular to the X axis in order to suppress unwanted excitation of acoustic waves in the capacitive element 1C.

In this example, the capacitive element 1 is disposed outside the region in which the crossing region of the electrode fingers 52 of the IDT electrode 50 extends in the arrangement direction. This configuration suppresses a situation in which the vibrations of acoustic waves excited by the IDT electrode 50 are transmitted to the capacitive element 1, and as a result, the electric power handling capability can be improved.

The capacitive element 1 may be housed inside the cover, disposed outside the cover, or so as to overlap the cover.

The thickness of the piezoelectric substrate 2 may be from 0.2 p to 2 p, where p is the pitch of the IDT electrode 50. More preferably, the thickness may be from 0.2 p to 1.0 p. In this case, the spurious reduction effect will be more pronounced.

The technologies described in the present disclosure are not limited to the above embodiments and variations, and may be implemented in a variety of ways.

The capacitive element according to the present disclosure is highly useful when used in a form in which the capacitive element is included in an acoustic wave device (in other words, combined with an acoustic wave element). For example, since the capacitive element includes a piezoelectric substrate, the piezoelectric substrate can be shared with an acoustic wave element in order to reduce the size of the acoustic wave device. In addition, for example, since the capacitive element can reduce the generation of unwanted acoustic waves, noise (spurious) that would enter the acoustic wave element can be reduced.

However, the capacitive element may constitute an electronic component by itself without being combined with other elements. The electronic element may also be combined with an element different from an acoustic wave element in order to form an electronic component. An element combined with the capacitive element does not need to include a piezoelectric substrate or use acoustic waves.

For example, the capacitive element may be included in an oscillator or sensor, or may be included in a micro electro mechanical system (MEMS). In either case, for example, an effect is achieved that, in a capacitive element, unwanted acoustic waves are reduced and consequently the generation of noise (unwanted electrical signals) caused by such acoustic waves is reduced.

An acoustic wave element combined with a capacitive element may be one that does not include an IDT electrode. Such an acoustic wave element may be, for example, a piezoelectric thin-film resonator including a piezoelectric thin film formed above a cavity and electrodes stacked on both sides of the piezoelectric thin film.

Acoustic wave elements include IDT electrodes may be configured in a variety of ways. For example, the acoustic waves utilized by an acoustic wave element may be any of various types of acoustic waves, and may be surface acoustic waves (SAWs), bulk waves, boundary acoustic waves, or plate waves (although the distinction between these waves does not have to be clear). The acoustic wave element may be a resonator or a filter. The IDT electrode is not limited to being one included in a one-port resonator or one included in a filter used in combination with a one-port resonator (for example, a ladder-type filter). For example, the IDT electrode may be included in a multimode filter (which may include a double-mode filter) or a transversal filter.

In the embodiment, the virtual line L1 is an extension of the center line of the second portion 81b. However, the virtual line L1 may instead be a line extending in the direction in which the second portion 81b extends (direction D1, first direction) from any position within the width of the second portion 81b. In the embodiment, a case in which the center line of the fourth portion 85b is located on the virtual line L1 is illustrated as an example of a configuration in which the fourth portion 85b is located on the virtual line L1. However, when it is said that the fourth portion 85b is located on the virtual line L1, any position within the width of the fourth portion 85b may be located on the virtual line L1. For example, the centerline of the fourth portion 85b may be located at a position where the distance from the virtual line L1 is ⅓ or less or ¼ or less of the width of the fourth portion 85b or the pitch of the electrode fingers (refer to the first spacing d1) when the virtual line L1 is an extension of the centerline of the second portion 81b. Even when it is said that the center line of the fourth portion 85b is located on the virtual line L1, it is natural that there may be inevitable manufacturing errors. Although the second portion 81b and the fourth portion 85b have been used as examples, the same applies to other equivalent portions. The above description of the virtual line and the portion of the electrode finger overlapping the virtual line may be applied to the extension line and the insertion electrode finger overlapping the extension line in the variation in FIG. 8.

REFERENCE SIGNS

1: capacitive element
2: piezoelectric substrate
10: capacitive part
32: electrode finger
32a: first electrode finger
32b: second electrode finger
100: acoustic wave device

The invention claimed is:
1. A capacitive element comprising:
a piezoelectric substrate;
a first bus bar and a second bus bar disposed spaced apart from each other in a first direction;
a plurality of first electrode fingers located on the piezoelectric substrate and extending towards a positive side in the first direction; and
a plurality of second electrode fingers located on the piezoelectric substrate, disposed facing and spaced apart from the first electrode finger in a second direction intersecting the first direction, extending towards a negative side in the first direction, and connected to a different potential from the first electrode finger,
wherein;
each first electrode finger among the plurality of first electrode fingers includes a first portion extending in the first direction and a second portion extending in the first direction from the first portion, through a first step portion, and at a different position in the second direction from the first portion,
each second electrode finger among the plurality of second electrode fingers includes a third portion disposed facing the second portion and extending in the first direction, and a fourth portion extending from the third portion, through a second step portion, disposed on a virtual line extending from the second portion in the first direction, and facing the first portion,
the first electrode fingers are arranged in the second direction with a period of twice a first spacing, which is a center spacing between the first portion and the second portion in the second direction, and connected to the first bus bar, and
the second electrode fingers are arranged in the second direction with a period of twice the first spacing and connected to the second bus bar.
2. The capacitive element according to claim 1, wherein a length of the first step portion is shorter than a length of the first portion, and
a length of the second step portion is shorter than a length of the fourth portion.
3. The capacitive element according to claim 1,
wherein respective first step portions of the plurality of first electrode fingers are located at different positions from each other in the first direction.
4. The capacitive element according to claim 3,
wherein each of the plurality of the first electrode fingers includes only the first step portion as a step portion.
5. The capacitive element according to claim 1,
wherein the virtual line extends in the first direction from a centerline of the second portion.
6. The capacitive element according to claim 5,
wherein each of the plurality of the first electrode fingers includes only the first step portion as a step portion.
7. The capacitive element according to claim 1,
wherein each of the plurality of the first electrode fingers includes only the first step portion as a step portion.
8. The capacitive element according to claim 1,
wherein each of the plurality of the first electrode fingers includes a protrusion extending from a connection between the second portion and the first step portion towards the fourth portion on the virtual line.
9. The capacitive element according to claim 1, further comprising:
at least one insertion electrode finger extending in the first direction on the piezoelectric substrate,
wherein the at least one insertion electrode finger includes at least one out of:

an insertion electrode finger connected to an identical potential to a respective first electrode finger among the plurality of the first electrode fingers and located on a virtual extension line extending, towards the negative side, from the second portion of the respective first electrode finger including the first step portion located furthest towards the negative side out of a plurality of first step portions, or an insertion electrode finger connected to an identical potential to a respective second electrode finger among the plurality of the second electrode fingers and located on a virtual extension line extending, towards the positive side, from the fourth portion of the respective second electrode finger including the second step portion located furthest towards the positive side out of a plurality of second step portions.

10. The capacitive element according to claim 1, further comprising:
at least one insertion electrode finger extending in the first direction on the piezoelectric substrate,
wherein the at least one insertion electrode finger includes at least one out of
a first insertion electrode finger connected to a different potential from a respective first electrode finger among the plurality of the first electrode fingers and located, along an entire length thereof, on a virtual extension line extending, towards the positive side, from the first portion of the respective first electrode finger including the first step portion located furthest toward the positive side out of respective first step portions of the respective first electrode finger, and
a second insertion electrode finger connected to a different potential from a respective second electrode finger among the plurality of the second electrode fingers and located, along an entire length thereof, on a virtual extension line extending, towards the negative side, from the third portion of the respective second electrode finger including the second step portion located furthest towards the negative side out of respective second step portions of the respective second electrode finger.

11. An acoustic wave device comprising:
the capacitive element according to claim 1; and
an IDT electrode including a plurality of repeatedly arranged excitation electrode fingers electrically connected to the capacitive element and located on the piezoelectric substrate.

12. The acoustic wave device according to claim 11, wherein a thickness of the piezoelectric substrate is less than twice a repetitive arrangement period of the repeatedly arranged excitation electrode fingers.

13. The capacitive element according to claim 1, wherein a difference between a sum of lengths of respective first portions of the plurality of first electrode fingers and a sum of lengths of respective second portions of the plurality of second electrode fingers is less than or equal to a length of one of the first electrode fingers in the first direction.

14. The capacitive element according to claim 1, wherein the first step portion extends in a direction perpendicular to the first direction.

15. The capacitive element according to claim 14, wherein each of the plurality of the first electrode fingers includes only the first step portion as a step portion.

16. An acoustic wave device comprising:
an IDT electrode including a plurality of repeatedly arranged excitation electrode fingers electrically located on a piezoelectric substrate, wherein a thickness of the piezoelectric substrate is less than twice a repetitive arrangement period of the repeatedly arranged excitation electrode fingers; and
a capacitive element, the capacitive element comprising:
the piezoelectric substrate;
a first electrode finger located on the piezoelectric substrate and extending towards a positive side in a first direction; and
a second electrode finger located on the piezoelectric substrate, disposed facing and spaced apart from the first electrode finger in a second direction intersecting the first direction, extending towards a negative side in the first direction, and connected to a different potential from the first electrode finger,
wherein the first electrode finger includes a first portion extending in the first direction and a second portion extending in the first direction from the first portion, through a first step portion, and at a different position in the second direction from the first portion, and
wherein the second electrode finger includes a third portion disposed facing the second portion and extending in the first direction, and a fourth portion extending from the third portion, through a second step portion, disposed on a virtual line extending from the second portion in the first direction, and facing the first portion.

17. A capacitive element comprising:
a piezoelectric substrate;
a first electrode finger located on the piezoelectric substrate and extending towards a positive side in a first direction; and
a second electrode finger located on the piezoelectric substrate, disposed facing and spaced apart from the first electrode finger in a second direction intersecting the first direction, extending towards a negative side in the first direction, and connected to a different potential from the first electrode finger,
wherein:
the first electrode finger includes a first portion extending in the first direction and a second portion extending in the first direction from the first portion, through a first step portion, and at a different position in the second direction from the first portion,
the second electrode finger includes a third portion disposed facing the second portion and extending in the first direction, and a fourth portion extending from the third portion, through a second step portion, disposed on a virtual line extending from the second portion in the first direction, and facing the first portion, and
the first electrode finger includes only the first step portion as a step portion.

18. A capacitive element comprising:
a piezoelectric substrate;
a first electrode finger located on the piezoelectric substrate and extending towards a positive side in a first direction; and
a second electrode finger located on the piezoelectric substrate, disposed facing and spaced apart from the first electrode finger in a second direction intersecting the first direction, extending towards a negative side in the first direction, and connected to a different potential from the first electrode finger,
wherein:
the first electrode finger includes a first portion extending in the first direction and a second portion extending in the first direction from the first portion, through a first step portion, and at a different position in the second direction from the first portion, the second electrode finger includes a third portion disposed facing the second portion and extending in the first direction, and a fourth portion extending from the third portion, through a second step portion, disposed on a virtual line extending from the second portion in the first direction, and facing the first portion, and the first electrode finger includes a protrusion extending from a connection between the second portion and the first step portion towards the fourth portion on the virtual line.

19. A capacitive element comprising:

a piezoelectric substrate;

at least one insertion electrode finger extending in a first direction on the piezoelectric substrate, a first electrode finger located on the piezoelectric substrate and extending towards a positive side in the first direction; and a second electrode finger located on the piezoelectric substrate, disposed facing and spaced apart from the first electrode finger in a second direction intersecting the first direction, extending towards a negative side in the first direction, and connected to a different potential from the first electrode finger, wherein:

the first electrode finger includes a first portion extending in the first direction and a second portion extending in the first direction from the first portion, through a first step portion, and at a different position in the second direction from the first portion, the second electrode finger includes a third portion disposed facing the second portion and extending in the first direction, and a fourth portion extending from the third portion, through a second step portion, disposed on a virtual line extending from the second portion in the first direction, and facing the first portion, and the at least one insertion electrode finger includes at least one of an insertion electrode finger connected to an identical potential to the first electrode fingers and located on a virtual extension line extending, towards the negative side, from the second portion of the first electrode finger including the first step portion located furthest towards the negative side out of a plurality of first step portions, or an insertion electrode finger connected to an identical potential to the second electrode fingers and located on a virtual extension line extending, towards the positive side, from the fourth portion of the second electrode finger including the second step portion located furthest towards the positive side out of a plurality of second step portions.

20. A capacitive element comprising:

a piezoelectric substrate;

at least one insertion electrode finger extending in a first direction on the piezoelectric substrate, a first electrode finger located on the piezoelectric substrate and extending towards a positive side in the first direction; and a second electrode finger located on the piezoelectric substrate, disposed facing and spaced apart from the first electrode finger in a second direction intersecting the first direction, extending towards a negative side in the first direction, and connected to a different potential from the first electrode finger, wherein:

the first electrode finger includes a first portion extending in the first direction and a second portion extending in the first direction from the first portion, through a first step portion, and at a different position in the second direction from the first portion, the second electrode finger includes a third portion disposed facing the second portion and extending in the first direction, and a fourth portion extending from the third portion, through a second step portion, disposed on a virtual line extending from the second portion in the first direction, and facing the first portion, and the at least one insertion electrode finger includes at least one of an insertion electrode finger connected to a different potential from the first electrode fingers and located, along an entire length thereof, on a virtual extension line extending, towards the positive side, from the first portion of the first electrode finger including the first step portion located furthest toward the positive side, or an insertion electrode finger connected to a different potential from the second electrode fingers and located, along an entire length thereof, on a virtual extension line extending, towards the negative side, from the third portion of the second electrode finger including the second step portion located furthest towards the negative side.

* * * * *